United States Patent
Schmalbuch et al.

(10) Patent No.: US 9,635,758 B2
(45) Date of Patent: *Apr. 25, 2017

(54) PANE WITH ELECTRICAL CONNECTION ELEMENT AND CONNECTION BRIDGE

(71) Applicant: SAINT-GOBAIN GLASS FRANCE, Courbevoie (FR)

(72) Inventors: Klaus Schmalbuch, Aachen (DE); Bernhard Reul, Herzogenrath (DE); Mitja Rateiczak, Wuerselen (DE); Lothar Lesmeister, Landgraaf (NL)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/439,852

(22) PCT Filed: Jul. 16, 2013

(86) PCT No.: PCT/EP2013/064987
§ 371 (c)(1),
(2) Date: Apr. 30, 2015

(87) PCT Pub. No.: WO2014/079594
PCT Pub. Date: May 30, 2014

(65) Prior Publication Data
US 2015/0296615 A1    Oct. 15, 2015

(30) Foreign Application Priority Data
Nov. 21, 2012 (EP) .................................... 12193522

(51) Int. Cl.
*H05K 1/09* (2006.01)
*H05B 3/84* (2006.01)
(Continued)

(52) U.S. Cl.
CPC .............. *H05K 1/09* (2013.01); *H01Q 1/1271* (2013.01); *H01Q 1/1278* (2013.01); *H05B 3/84* (2013.01);
(Continued)

(58) Field of Classification Search
CPC .......... H05K 1/09; H05K 1/11; H05K 1/0306; H01Q 1/1271; H01Q 1/1278
See application file for complete search history.

(56) References Cited

U.S. PATENT DOCUMENTS 2,481,385 A    9/1949 Bloom
2,644,066 A *  6/1953 Glynn ...................... H05B 3/84
                                                    29/517
(Continued)

FOREIGN PATENT DOCUMENTS

CA    2835381 A1    11/2012
DE    10046489 C1   12/2001
(Continued)

OTHER PUBLICATIONS

PCT Written Opinion mailed on Sep. 27, 2013 for PCT/EP2013/065175 filed on Jul. 18, 2013 in the name of Saint-Gobain Glass France.
(Continued)

*Primary Examiner* — Steven T Sawyer
(74) *Attorney, Agent, or Firm* — Steinfl + Bruno LLP

(57) ABSTRACT

A disk with at least one connecting element having a connecting bridge, including; a substrate having an electrically conductive structure on at least one partial region of the substrate, at least one electric connecting element on at least one partial region of the electrically conductive structure, a connecting bridge on at least one partial region of the connecting element and a lead-free solder mass that connects the electric connecting element in at least one partial (Continued)

Figure 1:
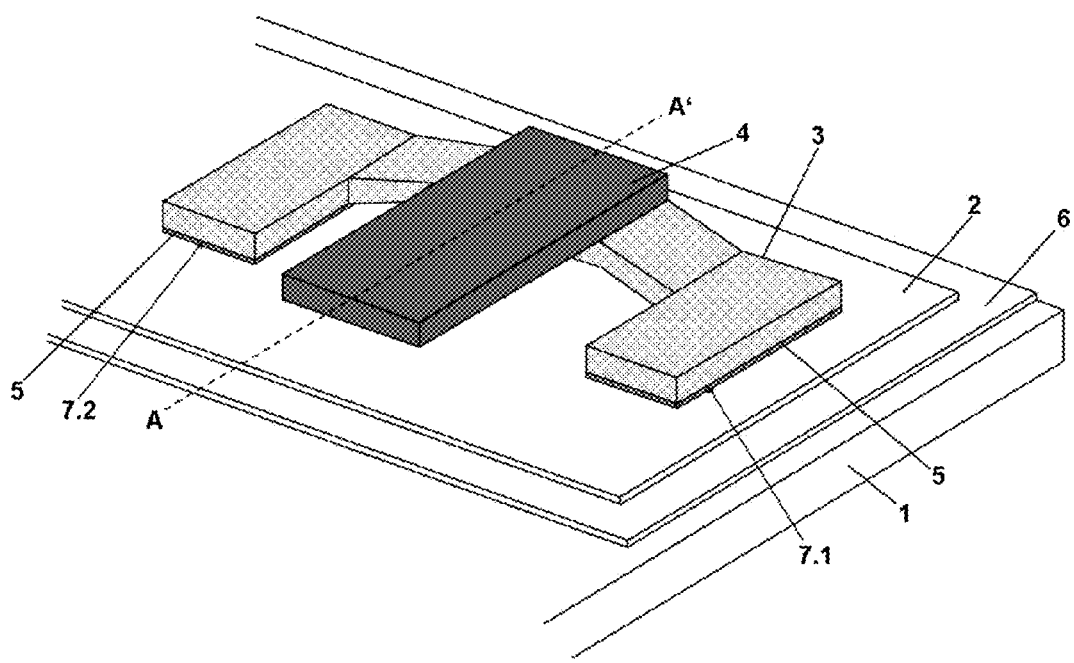

region with the electrically conductive structure, wherein the difference of the thermal expansion coefficient of the substrate and the connecting element is less than $5\times10^{-6}/°$ C., wherein the connecting bridge is formed in a massive manner and contains copper and wherein the material compositions of the connecting element and the connecting bridge differ.

19 Claims, 4 Drawing Sheets

(51) Int. Cl.
*H01Q 1/12* (2006.01)
*H05K 1/03* (2006.01)
*H05K 1/11* (2006.01)

(52) U.S. Cl.
CPC ............ *H05K 1/0306* (2013.01); *H05K 1/11* (2013.01); *H05B 2203/016* (2013.01)

(56) References Cited

U.S. PATENT DOCUMENTS

| | | | |
|---|---|---|---|
| 3,880,369 A | | 4/1975 | Kunstovney et al. |
| 4,023,008 A | | 5/1977 | Durussel |
| 4,385,202 A | * | 5/1983 | Spinelli ............... H01L 21/4857 174/252 |
| 5,283,104 A | * | 2/1994 | Aoude ..................... H01B 1/16 257/E23.075 |
| 2,709,211 A | | 5/1995 | Glynn |
| 5,590,017 A | * | 12/1996 | Kelso ................ H01L 23/49822 174/250 |
| 5,596,335 A | | 1/1997 | Dishart et al. |
| 5,738,554 A | | 4/1998 | Borger et al. |
| 6,790,104 B2 | | 9/2004 | Antaya et al. |
| 7,134,201 B2 | | 11/2006 | Ackerman et al. |
| 7,514,654 B2 | | 4/2009 | Okajima et al. |
| 7,909,665 B2 | | 3/2011 | Lyon |
| 8,905,778 B2 | | 12/2014 | Jenrich et al. |
| 9,385,437 B2 | | 7/2016 | Cholewa et al. |
| 2003/0030064 A1 | | 2/2003 | Takano et al. |
| 2006/0102610 A1 | * | 5/2006 | Hoepfner .................. H05B 3/84 219/203 |
| 2006/0240265 A1 | | 10/2006 | Cook et al. |
| 2007/0030064 A1 | | 2/2007 | Yu |
| 2007/0224842 A1 | | 9/2007 | Hoepfner et al. |
| 2008/0164248 A1 | | 7/2008 | Reul |
| 2008/0230269 A1 | | 9/2008 | Susai et al. |
| 2009/0170380 A1 | * | 7/2009 | Lyon ................. B32B 17/10036 439/874 |
| 2009/0277671 A1 | | 11/2009 | Hahn |
| 2010/0321798 A1 | | 12/2010 | Chen et al. |
| 2011/0056589 A1 | | 3/2011 | De Boer et al. |
| 2011/0056747 A1 | | 3/2011 | Matsushita et al. |
| 2011/0109115 A1 | | 5/2011 | Yamada et al. |
| 2012/0305311 A1 | | 12/2012 | Jenrich |
| 2012/0318566 A1 | | 12/2012 | Reul et al. |
| 2013/0043066 A1 | | 2/2013 | Cholewa et al. |
| 2014/0110166 A1 | | 4/2014 | Degen et al. |
| 2014/0158424 A1 | | 6/2014 | Schlarb et al. |
| 2014/0182932 A1 | | 7/2014 | Cholewa et al. |
| 2014/0301892 A1 | | 10/2014 | Maekawa et al. |
| 2015/0236431 A1 | | 8/2015 | Schmalbuch et al. |

FOREIGN PATENT DOCUMENTS

| | | |
|---|---|---|
| DE | 102006017675 A1 | 10/2007 |
| DE | 202008015441 U1 | 4/2010 |
| DE | 102009016353 | 10/2010 |
| DE | 102010018860 A1 | 11/2011 |
| EP | 0023121 A1 | 1/1981 |
| EP | 0720253 A2 | 7/1996 |
| EP | 1488972 A1 | 12/2004 |
| EP | 1942703 | 7/2008 |
| EP | 2299544 A1 | 3/2011 |
| EP | 2339894 | 6/2011 |
| EP | 2365730 A1 | 9/2011 |
| EP | 2408260 | 1/2012 |
| GB | 1163224 A | 9/1969 |
| JP | 2004189023 A | 7/2004 |
| WO | 2000058051 | 10/2000 |
| WO | 2004/068643 A1 | 8/2004 |
| WO | 2007/110610 A1 | 10/2007 |
| WO | 2007110610 | 10/2007 |
| WO | 2009/135469 A1 | 11/2009 |
| WO | 2012152542 A1 | 11/2012 |
| WO | 2012152543 | 11/2012 |
| WO | 2012152543 A1 | 11/2012 |

OTHER PUBLICATIONS

PCT Written Opinion mailed on Oct. 16, 2013 for PCT/EP2013/064987 filed on Jul. 16, 2013 in the name of Saint-Gobain Glass France.

PCT International Search Report mailed on Sep. 27, 2013 for PCT/EP2013/065175 filed on Jul. 18, 2013 in the name of Saint-Gobain Glass France.

PCT International Search Report mailed on Oct. 16, 2013 for PCT/EP2013/064987 filed on Jul. 16, 2013 in the name of Saint-Gobain Glass France.

Non-Final Office Action for U.S. Appl. No. 14/439,652, filed Apr. 29, 2015 on behalf of Mitja Rateiczak. Mail Date: Feb. 23, 2016. 10 pages.

* cited by examiner

PANE WITH ELECTRICAL CONNECTION ELEMENT AND CONNECTION BRIDGE

CROSS REFERENCE TO RELATED APPLICATIONS

The present application is the US national stage of International Patent Application PCT/EP2013/064987 filed on Jul. 16, 2013 which, in turn, claims priority to European application 12193522.5 filed on Nov. 21, 2012.

The invention relates to a pane with an electrical connection element, an economical and environmentally friendly method for its production, and its use.

The invention further relates to a pane with an electrical connection element for motor vehicles with electrically conductive structures such as, for instance, heating conductors or antenna conductors. The electrically conductive structures are customarily connected to the onboard electrical system via soldered-on electrical connection elements. Due to different coefficients of thermal expansion of the materials used, mechanical stresses occur during production and operation that strain the panes and can cause breakage of the pane.

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). Its objective is to ban extremely problematic components from products resulting from the massive increase in disposable electronics. The substances affected are lead, mercury, cadmium, and chromium. This relates, among other things, to the implementation of lead-free soldering materials in electrical applications on glass and the introduction of corresponding replacement products.

The previously known leadfree solder materials, as disclosed, for example, in EP 2 339 894 A1 and WO 2000058051, are, however, because of their lower ductility, not capable of compensating mechanical stresses to the same extent as lead. The conventional copper-containing connection elements have, however, a greater coefficient of thermal expansion than glass (CTE(copper)=$16.8 \times 10^{-6}/°$ C.), as a result of which damage to the glass occurs upon thermal expansion of the copper. For this reason, connection elements that have a low coefficient of thermal expansion, preferably on the order of magnitude of soda lime glass ($8.3 \times 10^{-6}/°$ C. for 0° C.-320° C.), are preferably used in conjunction with leadfree solder materials. Such connection elements hardly expand upon heating and compensate the emerging stresses.

EP 1 942 703 A2 discloses an electrical connection element on panes of motor vehicles, wherein the difference between the coefficients of thermal expansion of the pane and the electrical connection element is <$5 \times 10^{-6}/°$ C. and the connection element contains predominantly titanium. In order to enable adequate mechanical stability and processability, it is proposed to use an excess of solder material. The excess of solder material flows out from the intermediate space between the connection element and the electrically conductive structure. The excess of solder material causes high mechanical stresses in the glass pane. These mechanical stresses ultimately result in breakage of the pane. Also, titanium is difficult to solder. This results in poor adhesion of the connection element on the pane. The connection element must, moreover, be connected to the onboard electrical system via an electrically conductive material, for example, copper, possibly by welding. Titanium is difficult to weld.

EP 2 408 260 A1 describes the use of iron-nickel alloys or iron-nickel-cobalt alloys, such as, for instance, Kovar or Invar, which have a low coefficient of thermal expansion (CTE). Both Kovar (CTE=$5 \times 10^{-6}/°$ C.) and Invar (CTE as low as $0.55 \times 10^{-6}/°$ C. depending on the composition) have a lower CTE than soda lime glass and compensate the mechanical stresses. Invar has such a low coefficient of thermal expansion that overcompensation of these mechanical stresses occurs. This results in pressure stresses in the glass or tensile stresses in the alloy, which must, however, be categorized as noncritical.

An electrical connection of the connection element to the onboard electronics generally occurs via a connection bridge, on which the onboard voltage is applied via a cable or the like. According to the prior art, this connection bridge is formed in one piece with the connection element and runs parallel to the feet of the connection element. As described in WO 2007/110610 A1, the geometry of the one-piece connection element with a connection bridge should be optimized to the effect that the lowest possible voltages occur at the solder joint.

As the position of the connection bridge after installation of the glazing is often accessible only with difficulty, the connection bridge is frequently pre-bent such that it points vertically upward. In the case of copper-containing connection elements with a connection bridge formed in one piece, this reshaping can be carried out very easily due to the plasticity of the material. However, due to the high coefficient of thermal expansion of copper, these connection elements are hardly suitable for soldering on glass with leadfree solder materials. More suitable materials for use with leadfree solder materials, such as steel alloys or titanium, for example, have substantially higher hardness than copper, as a result of which reshaping of the connection bridge is rendered significantly more difficult.

The object of the present invention is to provide a pane with an electrical connection element and a connection bridge as well as an economical and environmentally friendly method for its production, wherein critical mechanical stresses in the pane are avoided and the bridge position is subsequently adjustable with simple tools.

The object of the present invention is accomplished according to the invention by a pane with a connection element, a method for its production, and its use according to the independent claims 1, 13, and 15. Preferred embodiments emerge from the subclaims.

The object of the present invention is accomplished according to the invention by a pane with at least one connection element with a connection bridge, wherein the material compositions of the connection element and the connection bridge are different. The arrangement comprises at least one substrate with an electrically conductive structure on at least one subregion of the substrate, at least one electrical connection element on at least one subregion of the electrically conductive structure, a connection bridge on at least one subregion of the connection element, and a leadfree solder material, which connects the electrical connection element to the electrically conductive structure in at least one subregion. The material composition of the connection element is selected such that the difference between the coefficients of thermal expansion of the substrate and the connection element is less than $5 \times 10^{-6}/°$ C. By this means, the thermal stresses of the pane are reduced and better adhesion is obtained. However, materials that have a suitable coefficient of thermal expansion often have high rigidity and/or high electrical resistance. However, high rigidity of the connection bridge renders reshaping more difficult, as a result of which the possibilities for subsequent adjustment of the bridge position by upward bending of the connection bridge are limited. High electrical resistance of the connection bridge is likewise disadvantageous since, in the installed state, a voltage is to be applied to the electrically conductive structure, and higher electrical resistance with the same voltage produces lower current flow. In the case of the one-piece connection elements with a connection bridge formed directly thereon known according to the prior art, the connection element and the connection bridge are necessarily made of the same material such that the connection element either has a suitable coefficient of thermal expansion whereas the connection bridge has excessively high rigidity and/or excessively low conductivity, or vice versa. On the contrary, the connection element with a connection bridge formed in two pieces according to the invention enables the combination of different materials such that the connection element itself is made from a material with a suitable coefficient of thermal expansion (difference from the CTE of the substrate less than $5 \times 10^{-6}/°$ C.), whereas the connection bridge is made of a copper-containing material that has sufficiently good reshapability. Because of the fact that the material compositions of the connection element and the connection bridge are, by choice, different, the materials of the two components can be optimally adapted to the corresponding requirements. The connection bridge according to the invention contains copper and is implemented as a solid. As a result, it is, on the one hand, quite reshapable and, at the same time, not highly flexible. A readily reshapable connection bridge can be bent into the desired position with little effort. As a result, this procedure can be performed manually. The solid implementation of the connection bridge ensures that after its reshaping, it also remains in the corresponding position. It is thus avoided for relatively small forces occurring during installation of the pane or during contacting of the connection bridge to change its position. This yields, even in the installed state of the pane, a readily accessible precisely defined bridge position. Moreover, non-solid highly flexible forms, such as cables or flat conductors, that are completely unsuitable for use as a connection bridge are ruled out. The electrical resistance of the connection bridge is selected according to the invention such that a large voltage drop on the connection bridge is avoided. The connection element with a connection bridge according to the invention thus, because of its two-piece form, optimally exploits the advantageous properties of the materials used at the corresponding locations and avoids the disadvantages of the one-piece connection elements known according to the prior art.

The connection element with a connection bridge is implemented with multiple pieces, at least two pieces, with the connection element and the connection bridge respectively forming at least one component. In a preferred embodiment, the connection element with a connection bridge is implemented in two pieces such that the connection element and the connection bridge each consist of one component. Alternatively, the connection element and the connection bridge can also each consist of any number of individual pieces.

In a preferred embodiment, the copper-containing material composition of the connection bridge as electrical resistance between 0.5 μOhm·cm and 20 μOhm·cm, preferably between 1.0 μOhm·cm and 15 μOhm·cm, particularly preferably between 1.5 μOhm·cm and 11 μOhm·cm. This yields a particularly advantageous combination of a connection element with a CTE adapted to the substrate and a connection bridge with improved conductivity. Comparable one-piece connection elements according to the prior art that also have a coefficient of thermal expansion adapted to the substrate have higher electrical resistances of the connection bridge such that a disadvantageously increased voltage drop occurs.

The connection element has at least one contact surface via which the connection element is connected by means of the leadfree solder material over its entire surface to a subregion of the electrically conductive structure. In a preferred embodiment, the connection element is stamped in the form of a bridge, with the connection element having two feet for contacting the electrically conductive structure, between which feet there is a raised section that does not make direct surface contact with the electrically conductive structure. The connection bridge is preferably applied on this bridge-shaped raised section. The connection element can include both a simple bridge shape and more complex bridge shapes. For example, a dumbbell shape with rounded feet that both effect a uniform tensile stress distribution and enable uniform solder distribution is conceivable. Preferably, connection elements with elongated solder feet are used, with the feet of the connection element pointing in the same direction as the connection bridge applied on the connection element. Such a design results in an advantageous increase in the pull-off force. In this embodiment as well, the corners of the connection element can be rounded in the region of the contact surfaces such that both a uniform distribution of the solder occurs and maximum values of tensile stresses on the corners are avoided.

The coefficient of thermal expansion of the connection element is preferably between $9 \times 10^{-6}/°$ C. and $13 \times 10^{-6}/°$ C., particularly preferably between $10 \times 10^{-6}/°$ C. and $11.5 \times 10^{-6}/°$ C., very particularly preferably between $10 \times 10^{-6}/°$ C. and $11 \times 10^{-6}/°$ C., and in particular between $10 \times 10^{-6}/°$ C. and $10.5 \times 10^{-6}/°$ C. in a temperature range from 0° C. to 300° C.

The connection element has, in contrast to the connection bridge, high rigidity and is difficult to reshape. This prevents deformation of the connection element at the time of the bending of the connection bridge. Particularly with bridge-shaped connection elements, a twisting of the bridge region occurs at the time of the reshaping of the connection bridge, which also results in damage to the solder connection between the connection element and the electrically conductive structure. Such a deformation of the connection element can be avoided, on the one hand, by the selection of a suitable geometry and, on the other, by the use of a material difficult to reshape. In a preferred embodiment, the material of the connection element has, at 20° C., a modulus of elasticity greater than or equal to 150 kN/mm², particularly preferably greater than or equal to 190 kN/mm².

The connection element according to the invention contains titanium, iron, nickel, cobalt, molybdenum, copper, zinc, tin, manganese, niobium, and/or chromium and/or alloys thereof.

The connection element according to the invention contains, preferably, a chromium-containing steel with a proportion of chromium greater than or equal to 10.5 wt.-%. Further alloy components such as molybdenum, manganese, or niobium result in improved corrosion stability or altered mechanical properties, such as tensile strength or cold formability.

The connection element according to the invention contains preferably at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and 0 wt.-% to 1 wt.-% titanium. In addition, the connection element can contain admixtures of other elements, including vanadium, aluminum, and nitrogen.

The connection element contains particularly preferably at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1.5 wt.-% molybdenum, 0 wt.-% to 1 wt.-% niobium, and 0 wt.-% to 1 wt.-% titanium. In addition, the connection element can contain admixtures of other elements, including vanadium, aluminum, and nitrogen.

The connection element contains very particularly preferably at least 77 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, 0 wt.-% to 1.5 wt.-% molybdenum, and 0 wt.-% to 1 wt.-% titanium. In addition, the connection element can contain admixtures of other elements, including vanadium, aluminum, and nitrogen.

Chromium-containing steel, in particular so-called "stainless steel" or "corrosion resistant steel" is available economically. Connection elements made of chromium-containing steel also have high rigidity in comparison to many conventional connection elements, made, for example, of copper, which results in an advantageous stability of the connection element. Particularly, with the preferred bridge-shaped connection elements, a twisting of the connection element at the time of reshaping of the connection element can thus be avoided. In addition, compared to many conventional connection elements, for example, those made of titanium, chromium-containing steel has improved solderability, due to higher thermal conductivity.

Particularly suitable chrome-containing steels are steels of the material numbers 1.4016, 1.4113, 1.4509, and 1.4510 in accordance with EN 10 088-2.

The material thickness of the connection element is preferably 0.1 mm to 2 mm, particularly preferably 0.2 mm to 1 mm, very particularly preferably 0.3 mm to 0.5 mm. In a preferred embodiment, the material thickness of the connection element is constant in its entire region. This is particularly advantageous with regard to simple production of the connection element.

The connection bridge contains copper or copper-containing alloys. Moreover, titanium, iron, nickel, cobalt, molybdenum, zinc, tin, manganese, niobium, silicon, and/or chromium and/or alloys thereof can be contained. A suitable material composition is selected according to its electrical resistance.

In a preferred embodiment, the connection bridge contains 45.0 wt.-% to 99.9 wt.-% copper, 0 wt.-% to 45 wt.-% zinc, 0 wt.-% to 15 wt.-% tin, 0 wt.-% to 30 wt.-% nickel, and 0 wt.-% to 5 wt.-% silicon. Besides electrolytic copper, a wide variety of brass or bronze alloys are suitable as materials, for example, nickel silver or Konstantan.

Particularly preferably, the connection bridge contains 58 wt.-% to 99.9 wt.-% copper and 0 wt.-% to 37.0 wt.-% zinc, in particular 60 wt.-% to 80 wt.-% copper and 20 wt.-% to 0 wt.-% zinc.

As a special example for the material of the connection bridge, electrolytic copper with the material number CW004A (formerly 2.0065) and CuZn30 with the material number CW505L (formerly 2.0265) must be mentioned.

The connection bridge is preferably applied in the bridge-shaped stamped part of the connection element, which has no direct surface contact with the electrically conductive structure. The purpose of the connection bridge is to enable connection of the connection element to the onboard electronics of a vehicle. The flow of current runs via the feet of the connection element to the central part of the connection element, on which the connection bridge is disposed, and then to the connection bridge. The centrally applied connection bridge thus constitutes a node on which the various subcurrents are combined. As a result of this, a low electrical resistance of the connection bridge is of particular significance in order to obtain the highest possible conductivity and, thus, the least possible voltage drop at this node.

The connection bridge can be shaped in a wide variety of geometries and preferably has an elongated shape. Both round and flat embodiments are conceivable. Elongated rectangular connection bridges that make possible a flat surface for optimal application of the connection bridge on the connection element are preferred. The width of such a rectangular connection bridge is 2 mm to 8 mm, preferably 4 mm to 7 mm, particularly preferably 4.5 mm to 6.5 mm, whereas its height measures 0.2 mm to 2 mm, preferably 0.5 mm to 1.5 mm, particularly preferably 0.7 mm to 0.9 mm. The length of the connection bridge is highly variable. The minimum length of the connection bridge depends on the contacting that is selected to electrically conductively connect the connection bridge to a voltage source. A plug connector that is slipped onto the free end of the connection bridge has, accordingly, a greater space requirement than, for example, a cable that is soldered directly onto the connection bridge. The connection bridge is preferably reshaped such that its free end no longer runs parallel to the substrate and points away from it. Accordingly, the connection bridge must be long enough that this reshaping can be accomplished. Typically, connection bridges with a length of 10 mm to 150 mm, preferably 20 mm to 80 mm, are used.

In a preferred embodiment, the connection bridge is dimensioned such that standard automotive blade terminals with a height of 0.8 mm and and a width of either 4.8 mm, 6.3 mm, or 9.5 mm can be plugged onto the free end of the connection bridge. The embodiment of the connection bridge with a width of 6.3 mm is particularly preferably used, since this corresponds to the flat automotive plugs according to DIN 46244 conventionally used in this sector. Standardizing the connection bridge adapted to the size of the conventional flat automotive plugs yields a simple and also reversible capability for connecting the conductive structure of the substrate to the onboard voltage. In the event of a broken connection cable, no soldered connection has to be redone to exchange the defective part; instead, the replacement cable is merely plugged onto the connection bridge. Alternatively, the electrical contacting of the connection bridge can, however, also occur via a soldered connection or a crimp connection.

Usable connection cables for the contacting of the connection bridge are, in principle, all cables that are known to the person skilled in the art for the electrical contacting of an electrically conductive structure. The connection cable can include, in addition to an electrically conductive core (inner conductor), an insulating, preferably polymer sheathing, with the insulating sheathing preferably removed in the end region of the connection cable to enable an electrically conductive connection between the connection element and the inner conductor.

The electrically conductive core of the connection cable can, for example, include copper, aluminum, and/or silver or alloys or mixtures thereof. The electrically conductive core can, for example, be implemented as a stranded wire conductor or as a solid wire conductor. The cross-section of the electrically conductive core of the connection cable depends on the current-carrying capacity required for the application of the pane according to the invention and can be selected appropriately by the person skilled in the art. The cross-section is, for example, from 0.3 mm² to 6 mm².

The connection bridge is electrically conductively connected to the connection element, with the possibility of connecting the element using various soldering or welding techniques. Preferably, the connection bridge and the connection element are connected using electrode resistance welding, ultrasonic welding, or friction welding.

In at least one subregion of the pane, an electrically conductive structure that preferably contains silver, particularly preferably silver particles and glass frits, is mounted. The electrically conductive structure according to the invention has, preferably, a layer thickness from 3 µm to 40 µm, particularly preferably from 5 µm to 20 µm, very particularly preferably, from 7 µm to 15 µm, and, in particular, from 8 µm to 12 µm. The connection element is connected via a contact surface over its entire surface to a subregion of the electrically conductive structure. The electrical contacting occurs by means of the leadfree solder material. The electrically conductive structure can, for example, serve to contact wires or a coating applied on the pane. The electrically conductive structure is applied, for example, in the form of bus bars on opposite edges of the pane. A voltage can be applied via the connection elements applied to the bus bars, as a result of which a current flows through the conductive wires or the coating from one bus bar to the other and heats the pane. Alternatively to such a heating function, the pane according to the invention can also conceivably be used in combination with antenna conductors or even in any other arrangement with which a stable contacting of the pane is required.

The substrate contains, preferably, glass, particularly preferably, flat glass, float glass, quartz glass, borosilicate glass, and/or soda lime glass. The substrate can, however, also contain polymers, preferably, polyethylene, polypropylene, polycarbonate, polymethyl methacrylate, polystyrene, polybutadiene, polynitriles, polyester, polyurethane, polyvinyl chloride, polyacrylates, polyamide, polyethylene terephthalate, and/or copolymers or mixtures thereof. The substrate is preferably transparent. The substrate preferably has a thickness of 0.5 mm to 25 mm, particularly preferably of 1 mm to 10 mm, and very particularly preferably of 1.5 mm to 5 mm.

The coefficient of thermal expansion of the substrate is preferably $8 \times 10^{-6}/°$ C. to $9 \times 10^{-6}/°$ C. The substrate contains, preferably, glass that has, preferably, a coefficient of thermal expansion from $8.3 \times 10^{-6}/°$ C. to $9 \times 10^{-6}/°$ C. in a temperature range from 0° C. to 300° C.

The electrically conductive structure is electrically conductively connected to the connection element via the leadfree solder material. The leadfree solder material is disposed on the contact surfaces that are situated on the bottom of the connection element.

The layer thickness of the leadfree solder material is preferably less than or equal to 600 µm, particularly preferably between 150 µm and 600 µm, in particular, less than 300 µm.

The leadfree solder material is preferably leadfree. This is particularly advantageous in view of the environmental impact of the pane with an electrical connection element according to the invention. In the context of the invention, "leadfree solder material" means a solder material that includes, in accordance with EC Directive "2002/95/EC on the Restriction of the Use of Certain Hazardous Substances in Electrical and Electronic Equipment", a lead proportion less than or equal to 0.1 wt.-%, preferably no lead.

Leadfree solder materials typically have less ductility than lead-containing solder materials, such that mechanical stresses between a connection element and a pane can be less well compensated. However, it has been demonstrated that critical mechanical stresses can be prevented by means of the connection element according to the invention. The solder material contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of bismuth, indium, zinc, copper, or silver can be 0 wt.-%. The solder composition can contain nickel, germanium, aluminum, or phosphorus at a proportion of 0 wt.-% to 5 wt.-%. The solder composition according to the invention contains, very particularly preferably, Bi40Sn57Ag3, Sn40Bi57Ag3, Bi59Sn40Ag1, Bi57Sn42Ag1, In97Ag3, In60Sn36.5Ag2Cu1.5, Sn95.5Ag3.8Cu0.7, Bi67In33, Bi33In50Sn17, Sn77.2In20Ag2.8, Sn95Ag4Cu1, Sn99Cu1, Sn96.5Ag3.5, Sn96.5Ag3Cu0.5, Sn97Ag3, or mixtures thereof.

In an advantageous embodiment, the solder material contains bismuth. It has been demonstrated that a bismuth-containing solder material results in particularly good adhesion of the connection element according to the invention to the pane, by means of which damage to the pane can be avoided. The proportion of bismuth in the solder material composition is preferably from 0.5 wt.-% to 97 wt.-%, particularly preferably 10 wt.-% to 67 wt.-%, and very particularly preferably from 33 wt.-% to 67 wt.-%, in particular from 50 wt.-% to 60 wt.-%. In addition to bismuth, the solder material preferably contains tin and silver or tin, silver, and copper. In a particularly preferred embodiment, the solder material includes at least 35 wt.-% to 69 wt.-% bismuth, 30 wt.-% to 50 wt.-% tin, 1 wt.-% to 10 wt.-% silver, and 0 wt.-% to 5 wt.-% copper. In a very particularly preferred embodiment, the solder material contains at least 49 wt.-% to 60 wt.-% bismuth, 39 wt.-% to 42 wt.-% tin, 1 wt.-% to 4 wt.-% silver, and 0 wt.-% to 3 wt.-% copper.

In another advantageous embodiment, the solder material contains from 90 wt.-% to 99.5 wt.-% tin, preferably from 95 wt.-% to 99 wt.-%, particularly preferably from 93 wt.-% to 98 wt.-%. In addition to tin, the solder material preferably contains from 0.5 wt.-% to 5 wt.-% silver and from 0 wt.-% to 5 wt.-% copper.

The solder material flows out with an outflow width of preferably less than 1 mm from the intermediate space between the solder region of the connection element and the electrically conductive structure. In a preferred embodiment, the maximum outflow width is less than 0.5 mm and, in particular, roughly 0 mm. This is particularly advantageous with regard to the reduction of mechanical stresses in the pane, the adhesion of the connection element, and the savings in the amount of solder. The maximum outflow width is defined as the distance between the outer edges of the solder region and the point of the solder material crossover, at which the solder material drops below a layer thickness of 50 µm. The maximum outflow width is measured on the solidified solder material after the soldering process. A desired maximum outflow width is obtained through a suitable selection of solder material volume and vertical distance between the connection element and the electrically conductive structure, which can be determined by simple experiments. The vertical distance between the connection element and the electrically conductive structure can be predefined by an appropriate process tool, for example, a tool with an integrated spacer. The maximum outflow width can even be negative, i.e., pulled back into the intermediate space formed by the solder region of the electrical connection element and an electrically conductive structure. In an advantageous embodiment of the pane according to the invention, the maximum outflow width is pulled back in a concave meniscus into the intermediate space formed by the solder region of the electrical connection element and the electrically conductive structure. A concave meniscus is created, for example, by increasing the vertical distance between the spacer and the conductive structure during the soldering process, while the solder is still fluid. The advantage resides in the reduction of mechanical stresses in the pane, in particular, in the critical region that is present with a large solder material crossover.

In an advantageous embodiment of the invention, the contact surface of the connection element has spacers, preferably at least two spacers, particularly preferably at least three spacers. The spacers are preferably implemented in one piece with the connection element, for example, by stamping or deep drawing. The spacers preferably have a width of $0.5 \times 10^{-4}$ m to $10 \times 10^{-4}$ m and a height of $0.5 \times 10^{-4}$ m to $5 \times 10^{-4}$ m, particularly preferably of $1 \times 10^{-4}$ m to $3 \times 10^{-4}$ m. By means of the spacers, a homogeneous, uniformly thick, and uniformly fused layer of the solder material is obtained. Thus, mechanical stresses between the connection element and the pane can be reduced and the adhesion of the connection element can be improved. This is particularly advantageous with the use of leadfree solder materials that can compensate mechanical stresses less well due to their lower ductility compared to lead-containing solder materials.

In an advantageous embodiment of the invention, at least one contact bump, which serves for contacting the connection element with the soldering tool during the soldering process, is disposed on the surface of the solder region of the connection element facing away from the substrate. The contact bump is preferably curved convexly at least in the region of contacting with the soldering tool. The contact bump preferably has a height of 0.1 mm to 2 mm, particularly preferably of 0.2 mm to 1 mm. The length and width of the contact bump is preferably between 0.1 and 5 mm, very particularly preferably between 0.4 mm and 3 mm. The contact bumps are preferably implemented in one piece with the connection element, for example, by stamping or deep drawing. For the soldering, electrodes whose contact side is flat can be used. The electrode surface is brought into contact with the contact bump. For this, the electrode surface is disposed parallel to the surface of the substrate. The contact region between the electrode surface and the contact bump forms the solder joint. The position of the solder joint is determined by the point on the convex surface of the contact bump that has the greatest vertical distance from the surface of the substrate. The position of the solder joint is independent of the position of the solder electrode on the connection element. This is particularly advantageous with regard to a reproducible, uniform heat distribution during the soldering process. The heat distribution during the soldering process is determined by the position, the size, the arrangement, and the geometry of the contact bump.

The electrical connection element has, preferably at least on the contact surface facing the solder material, a coating (wetting layer) that contains nickel, copper, zinc, tin, silver, gold, or alloys or layers thereof, preferably silver. By this means, improved wetting of the connection element with the solder material and improved adhesion of the connection element are achieved.

The connection element according to the invention is preferably coated with nickel, tin, copper, and/or silver. The connection element according to the invention is particularly preferably provided with an adhesion-promoting layer, preferably made of nickel and/or copper, and, additionally, with a solderable layer, preferably made of silver. The connection element according to the invention is coated, very particularly preferably, with 0.1 µm to 0.3 µm nickel and/or 3 µm to 20 µm silver. The connection element can be plated with nickel, tin, copper, and/or silver. Nickel and silver improve the current-carrying capacity and corrosion stability of the connection element and the wetting with the solder material.

The connection bridge can optionally also have a coating. A coating of the connection bridge is, however, not essential since no direct contact exists between the connection bridge and the solder material. Thus, no optimization of the wetting properties of the connection bridge is required. This reduces the production costs of the pane according to the invention with a connection element and a connection bridge since coating of the connection bridge can be dispensed with and only the connection element is coated.

In an alternative embodiment, the connection bridge has a coating that contains nickel, copper, zinc, tin, silver, gold, or alloys or layers thereof, preferably silver. Preferably the connection bridge is coated with nickel, tin, copper, and/or silver. Very particularly preferably, the connection bridge is coated with 0.1 µm to 0.3 µm nickel and/or 3 µm to 20 µm silver. The connection bridge can be plated with nickel, tin, copper, and/or silver.

The shape of the electrical connection element can form one or a plurality of solder depots in the intermediate space of the connection element and the electrically conductive structure. The solder depots and wetting properties of the solder on the connection element prevent the outflow of the solder material from the intermediate space. Solder depots can be rectangular, rounded, or polygonal in design.

The invention further includes a method for producing a pane with a two-piece connection element with a connection with including the following steps:
a) a connection bridge is electrically conductively affixed on the top of the connection element,
b) on the bottom of the connection element, a leadfree solder material is applied on at least one contact surface,
c) the connection element with the leadfree solder material is arranged on an electrically conductive structure, and
d) the connection element is soldered to the electrically conductive structure.

The electrically conductive structure can be applied to the substrate by methods known per se, for example, by screen-printing methods. The application of the electrically conductive structure can take place before, during, or after the process steps (a) and (b).

The solder material is preferably applied to the connection element as a platelet or a flattened drop with a fixed layer thickness, volume, shape, and arrangement. The layer thickness of the solder material platelet is preferably less than or equal to 0.6 mm. The shape of the solder material platelet preferably corresponds to the shape of the contact surface. If the contact surface is implemented, for example, as a rectangle, the solder material platelet preferably has a rectangular shape.

The introduction of energy during the electrical connecting of an electrical connection element and an electrically conductive structure occurs preferably by means of punches, thermodes, piston soldering, microflame soldering, preferably laser soldering, hot air soldering, induction soldering, resistance soldering, and/or with ultrasound.

Preferably, the connection bridge is welded or soldered on the top of the connection element. Particularly preferably, the connection bridge is affixed on the connection element by electrode resistance welding, ultrasonic welding, or friction welding.

Following process step (d), a reshaping of the connection bridge is optionally carried out. Since the free end of the connection bridge is reachable only with difficulty after installation of the pane in the vehicle body, reshaping of the connection bridge enables substantially improved accessibility of the bridge position. Moreover, by means of this bending, a precisely defined bridge position is obtainable. After reshaping, the free end of the connection bridge points away from the substrate. The angle that the free end of the connection bridge assumes relative to the substrate surface is freely selectable depending on the requirements. Since the connection bridge according to the invention is readily reshapable, only slight forces must be applied for the bending of the connection bridge. Since the connection bridge is made of a solid material and is not highly flexible, a plastic reshaping occurs and the position of the connection bridge is precisely definable. The reshaping of the connection bridge according to the invention occurs purely manually and without any tools. With the slight forces occurring, twisting of the connection element, which is substantially stiffer compared to the connection bridge, is avoided. In this manner, associated damage to the solder joint is likewise prevented.

After installation of the pane in the vehicle and possible reshaping, the connection bridge is connected to the onboard electronics system via a plug connector, a metal plate a stranded wire, or a braided conductor, made, for example, of copper. Preferably, a plug connector is selected that, on the one hand, ensures lasting stability and prevents the contact from slipping out of position, but is, on the other hand, also reversible. As a result, the connection cable between the connection bridge and the onboard electronics system can be replaced in a simple manner if damaged. In contrast, the other contacting possibilities mentioned require soldering or welding of the contact.

The invention further includes the use of the pane with electrically conductive structures according to the invention in vehicles, architectural glazing or building glazing, in particular in motor vehicles, rail vehicles, aircraft, or watercraft. The connection element serves for connection of electrically conductive structures of the pane such as, for instance, heating conductors or antenna conductors, to external electrical systems such as amplifiers, control units, or voltage sources. The invention includes, in particular, the use of the pane according to the invention in rail vehicles or motor vehicles, preferably as a windshield, rear window, side window, and/or glass roof, in particular as a heatable pane or as a pane with an antenna function.

The invention is explained in detail with reference to drawings and exemplary embodiments. The drawings are schematic representations and not true to scale. The drawings in no way restrict the invention. They depict:

FIG. 1 a schematic perspective view of a pane with a connection element and a connection bridge according to the invention.

Figure 2:
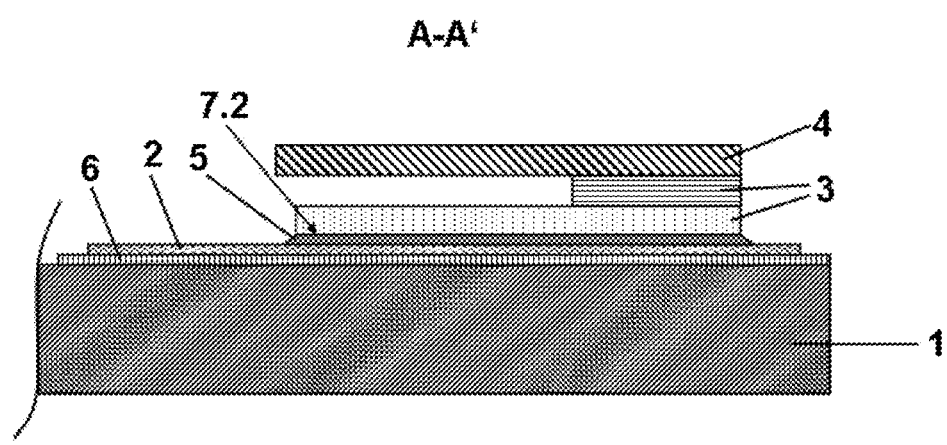

FIG. 2 a cross-section of the pane according to FIG. 1 along the section line AA'.

Figure 3:
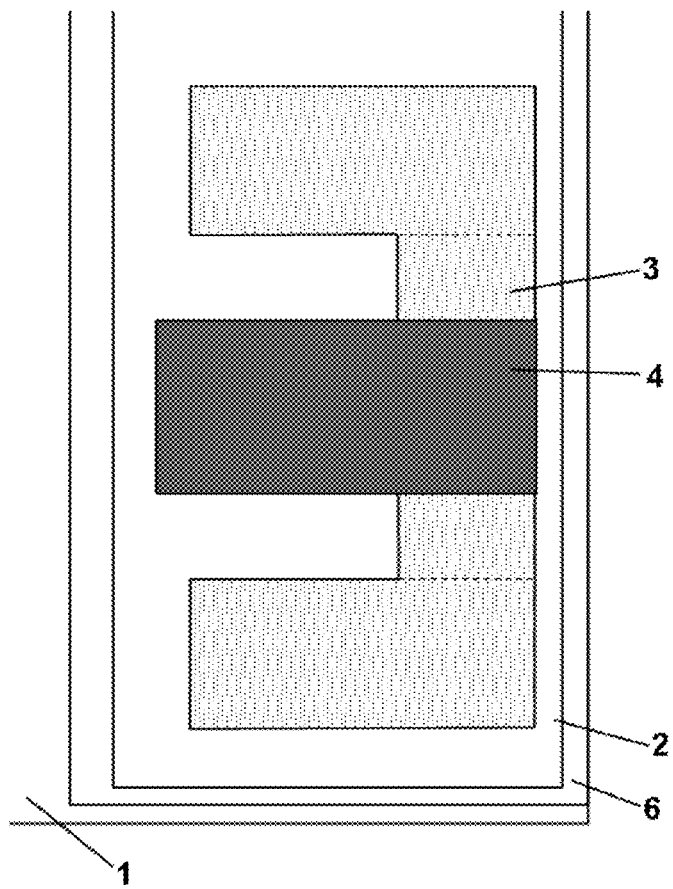

FIG. 3 a top plan view of the pane according to FIG. 1.

Figure 4:
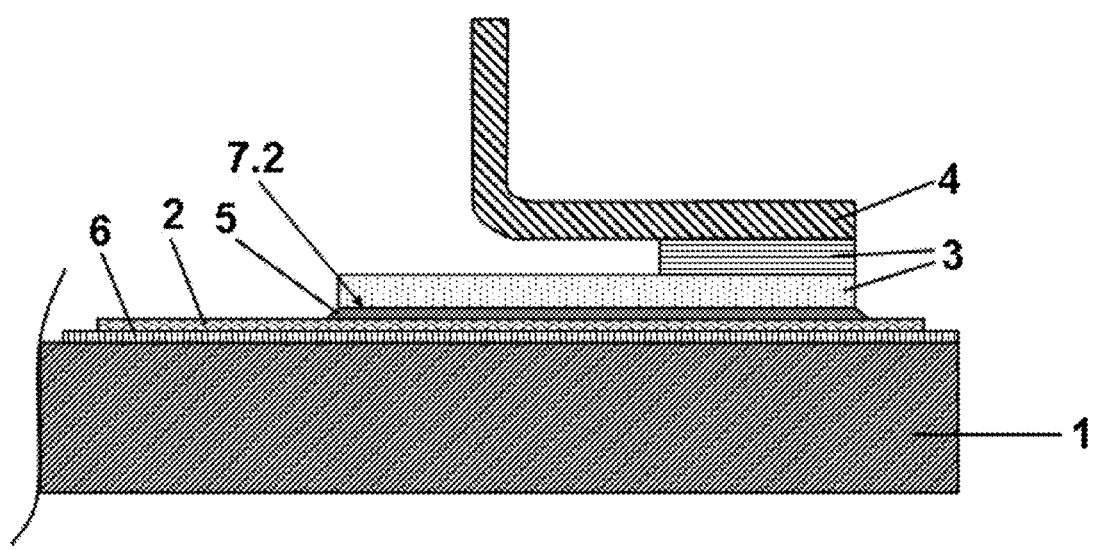

FIG. 4 a pane according to the invention according to FIGS. 1 and 2 with a connection element and reshaped connection bridge.

Figure 5A:
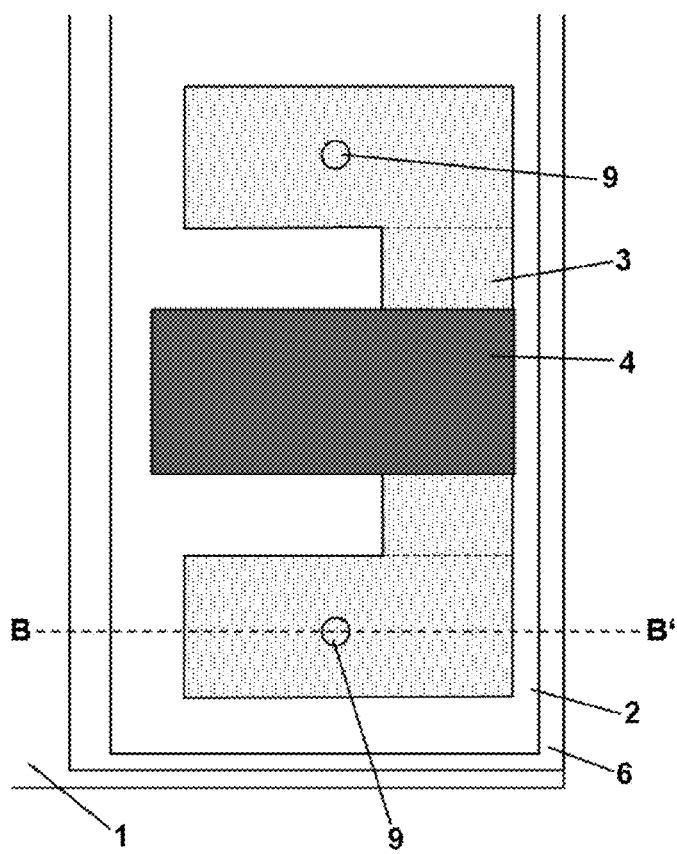

FIG. 5a a top plan view of another embodiment of the pane with a connection element and a connection bridge according to the invention as well as additional contact bumps and spacers.

Figure 5B:
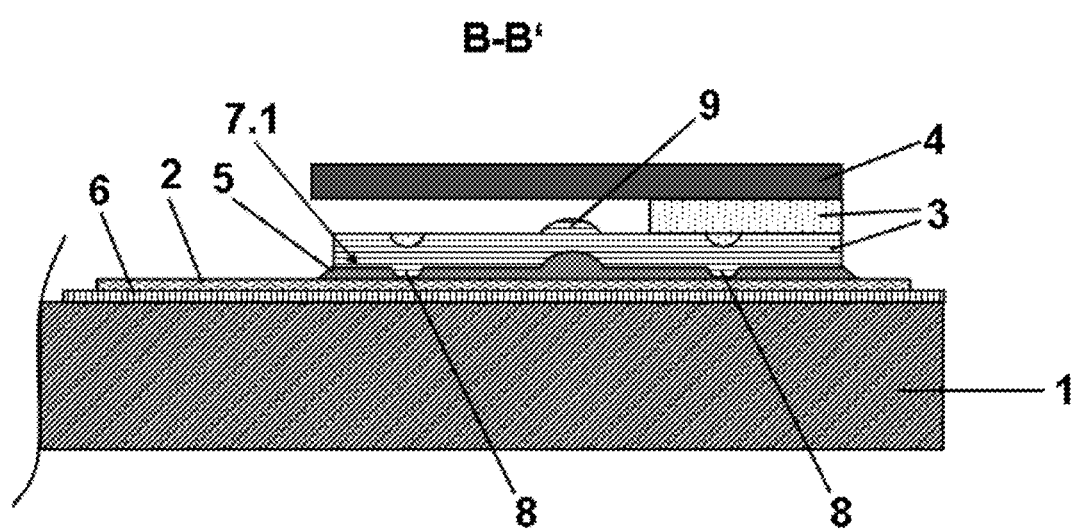

FIG. 5b a cross-section of the pane according to FIG. 5a along the section line BB'.

Figure 6:
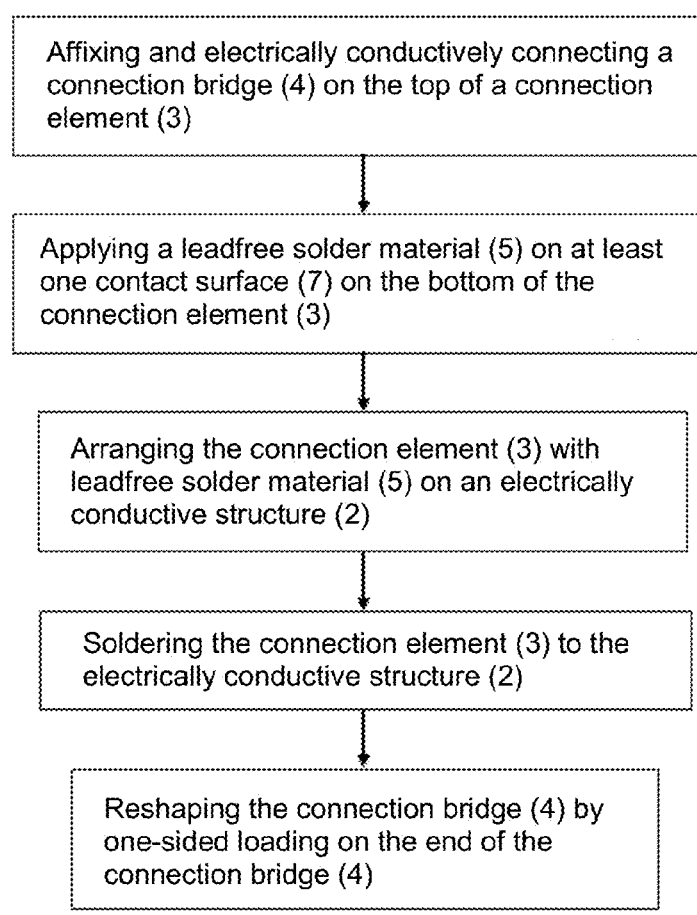

FIG. 6 a flowchart of the method according to the invention for producing a pane with a connection element and a connection bridge.

FIG. 1 depicts a pane with a connection element (3) and a connection bridge (4) according to the invention. A covering screenprint (6) is applied on a substrate (1) made of a 3-mm-thick thermally prestressed single pane safety glass made of soda lime glass. The substrate (1) has a width of 150 cm and a height of 80 cm, with a connection element (3) with a connection bridge (4) mounted on the shorter side edge in the region of the covering screenprint (6). An electrically conductive structure (2) in the form of a heating conductor structure is applied on the surface of the substrate (1). The electrically conductive structure contains silver particles and glass frits, with the silver proportion being greater than 90%. In the edge region of the pane (I), the electrically conductive structure (2) is widened to a width of 10 mm. In this region, a leadfree solder material (5) that connects the electrically conductive structure (2) to the contact surfaces (7) of the connection element (3) is applied. After installation in the vehicle body, the contacting is hidden by the covering screenprint (6). The leadfree solder material (5) ensures a lasting electrical and mechanical connection of the electrically conductive structure (2) to the connection element (3). The leadfree solder material (5) contains 57 wt.-% bismuth, 42 wt.-% tin, and 1 wt.-% silver. The leadfree solder material (5) has a thickness of 250 µm. The connection element (3) has a bridge shape. The connection element includes two feet, each with a contact surface (7.1, 7.2) on its bottom and a bridge-shaped section, which extends between the feet. In the bridge-shaped section, the connection bridge (4) is welded on the surface of the connection element (3). The connection bridge (4) is aligned flush with an outer edge of the connection element (3) and points beyond the opposite outer edge in the direction of the feet of the connection element (3), with the connection element (3) and the connection bridge (4) together yielding an E-shaped arrangement. The electrical connection element (3) has a width of 4 mm and a length of 24 mm and is made of steel of the material number 1.4509 in accordance with EN 10 088-2 (ThyssenKrupp Nirosta® 4509) with a coefficient of thermal expansion of $10.5 \times 10^{-6}/°$C. in the temperature range from 20° C. to 300° C. The material thickness of the connection element (3) is 0.8 mm. The connection bridge (4) has a height of 0.8 mm, a width of 6.3 mm, and a length of 27 mm. The connection bridge (4) is made of copper of the material number CW004A (Cu-ETP) with an electrical resistance of 1.8 µOhm·cm.

FIG. 2 depicts a cross-section of the pane according to FIG. 1 along the section line AA'. The covering screenprint (6) is applied on the substrate (1) on which the electrically conductive structure (2) is situated. The bridge-shaped section of the connection element (3), which is cut by the section line AA', is depicted with hatch lines, whereas the foot of the connection element (3) is depicted with dots. The connection bridge (4) lies on the bridge-shaped section of the connection element (3) and is welded there. The second contact surface (7.2), on which the foot of the connection element (3) contacts the electrically conductive structure (2), is situated on the bottom of the connection element (3). The leadfree solder material (5) is applied on the second contact surface (7.2) for the electrically conductive and mechanically stable connection of the connection element and the electrically conductive structure. The leadfree solder material (5) flows out with a concave meniscus from the gap between the connection element (3) and the electrically conductive structure (2). The part of the connection element (3) with the first contact surface (7.1) (not shown) is configured analogous to the part of the connection element (3) described here.

FIG. 3 depicts a top plan view of the pane according to FIG. 1. The connection element (3) and the connection bridge (4) together form an E-shaped arrangement, wherein the connection bridge (4) runs between the feet of the connection element (3), parallel thereto, and points in the same direction.

FIG. 4 depicts a pane according to the invention according to FIGS. 1 and 2 with a connection element (3) and a reshaped connection bridge (4) along the section line AA'. The general structure of the depicted pane according to the invention corresponds to that described in FIGS. 1 and 2, with the connection bridge (4) bent upward away from the substrate (1). The free end of the connection bridge (4), which is not connected directly to the connection element (3), assumes an angle of 90° relative to the surface of the substrate (1) and an points away from it. In this manner, even in the installed state, the bridge position is substantially better accessible and is precisely defined.

FIGS. 5a and 5b depict another embodiment of the pane according to the invention with a connection element (3) and a connection bridge (4) as well as additional spacers (8) and contact bumps (9). In the top plan view depicted in FIG. 5a, the spacers (8) are hidden by the connection element (3). FIG. 5b depicts a cross-section through one foot of the connection element (3) along the section line BB'. The cut surfaces of the connection element are depicted with hatch lines. The view depicted in FIG. 5b makes two spacers (8) on the first contact surface (7.1) of the connection element (3) discernible. The second contact surface (7.2) has two analogously arranged spacers (8) (not shown here). The spacers (8) are stamped on the contact surfaces (7) in the feet of the connection element (3) and thus implemented in one piece therewith. The spacers (8) are shaped as spherical segments and have a height of $2.5 \times 10^{-4}$ m and a width of $5 \times 10^{-4}$ m. The formation of a uniform layer of the leadfree solder material (5) is promoted by the spacers (8). This is particularly advantageous with regard to the adhesion of the connection element (3). The contact bumps (9) are disposed on the surface of the connection element (3) facing away from the substrate (1) opposite the contact surfaces (7). The contact bumps (9) are stamped in the feet of the connection element (3) and thus implemented in one piece therewith. The contact bumps (9) are shaped as a spherical segment and have a height of $2.5 \times 10^{-4}$ m and a width of $5 \times 10^{-4}$ m. The contact bumps (9) serve for the contacting of the connection element (3) with the soldering tool during the soldering procedure. By means of the contact bumps (9), a reproducible and defined heat distribution is ensured, independent of the exact positioning of the soldering tool.

FIG. 6 depicts a flowchart of the method according to the invention for producing a pane with a connection element (3) and a connection bridge (4). First, a connection bridge (4) is electrically conductively applied on the top of the connection element (3). Then, a leadfree solder material (5) is applied on the bottom of the connection element (3) on at least one contact surface (7), and the connection element (3) is arranged with the leadfree solder material (5) on the electrically conductive structure (2). After that, the connection element (3) is soldered to the electrically conductive structure (2). Preferably, the connection bridge (4) is then reshaped by one-sided loading on the outer free end of the connection bridge to ensure better accessibility of the connection bridge (4). The reshaping of the connection bridge (4) can occur directly following the preceding step or only after installation of the pane in the vehicle body, preferably after installation of the pane.

In the following, the invention is compared using a series of tests of panes with one-piece connection elements according to the prior art and the pane according to the invention with a two-piece connection element and connection bridge, in each case in conjunction with a leadfree solder material.

Table 1 presents a small selection of different materials that can be used in connection elements known according to the prior art and/or in connection elements according to the invention. The references listed in the last column refer to the source of the indicated physical properties.

TABLE 1

| Material | Material Number | E-Modulus (kN/mm$^2$) | Electrical Resistance (μOhm · cm) | CTE ($\cdot 10^{-6}$/° C.) | Source |
| --- | --- | --- | --- | --- | --- |
| Copper | CW004A | 130 | 1.8 | 16.8 | 1 |
| CuZn30 | CW505L | 115 | 6.2 | 19.0 | 1 |
| ThyssenKrupp Nirosta ® 4016 | 1.4016 | 220 | 60 | 10.0 | 2 |
| ThyssenKrupp Nirosta ® 4113 | 1.4113 | 220 | 60 | 10.0 | 2 |
| ThyssenKrupp Nirosta ® 4509 | 1.4509 | 220 | 60 | 10.0 | 2 |
| ThyssenKrupp Nirosta ® 4510 | 1.4510 | 220 | 60 | 10.0 | 2 |
| Titanium | 3.7024/ 3.7025 | 105 | 4.7 | 8.9 | 2 |

Source 1: Werkstoffdatenblätter Deutsches Copperinstitut [Material Data Sheets German Copper Institute]
Source 2: Werkstoffdatenblätter ThyssenKrupp [Material Data Sheets ThyssenKrupp]

In a series of tests, a connection element (3) according to the invention with a connection bridge (4) was compared with three different connection elements according to the prior art. To ensure comparability, both the two-piece connection element with a connection bridge according to the invention and the connection elements formed in one piece known according to the prior art were used in the same geometry. The geometry of the connection elements corresponded to the arrangement depicted in FIG. 1. As a substrate (1) a 3-mm-thick thermally prestressed single pane safety glass made of soda lime glass with a covering screenprint (6) was applied. The substrate (1) had a width of 150 cm and a height of 80 cm, with a connection element with a connection bridge (4) having been mounted on the shorter side edge in the region of the screenprint (6). The connection elements used in each case included two feet each with one contact surface (7.1, 7.2) on its bottom. An electrically conductive structure (2) in the form of a heating conductor structure was applied on the surface of the substrate (1). The electrically conductive structure contained silver particles and glass frits, with the silver proportion selected greater than 90%. In the edge region of the pane (I), the electrically conductive structure (2) was widened to 10 mm. The different connection elements were mounted on this region. For this, a leadfree solder material (5) made of 57 wt.-% bismuth, 42 wt.-% tin, and 1 wt.-% silver was used, which was applied with a thickness of 250 μm between the contact surfaces (7) of the connection element and the electrically conductive structure (2). The connection elements used in the example and in the comparative examples had the same bridge shape. In each case, a connection bridge on the surface of the connection element was situated in the bridge-shaped section of the connection element. The connection bridge was aligned flush with the outer edge of the connection element and pointed beyond the opposite outer edge in the direction of the feet of the connection element, with the connection element and the connection bridge together yielding an E-shaped arrangement. The connection elements used had a width of 4 mm and a length of 24 mm. The material thickness of the connection elements was 0.8 mm and the connection bridge had a height of 0.8 mm, a width of 6.3 mm and a length of 27 mm. In the comparative examples, the connection bridges were formed in one piece with the connection elements and, thus, were made out of the same material. In the example according to the invention, the connection bridge (4) was welded on the surface of the connection element (3) according to the invention. The connection bridge (4) and the connection element (3) were, in that case, formed in two pieces and were made of different materials.

Table 2 presents the materials of the connection element and the connection bridge used in the example according to the invention and in the comparative examples as well as the one-piece or two-piece execution of the connection element and the connection bridge.

TABLE 2

|  | Material Connection Element | Material Connection bridge | Execution |
|---|---|---|---|
| Example 1 | ThyssenKrupp Nirosta ® 4509, Material No. 1.4509 | Copper, Material No. CW004A | two-piece |
| Comparative Example 2 | Copper, Material No. CW004A | Copper, Material No. CW004A | one-piece |
| Comparative Example 3 | ThyssenKrupp Nirosta ® 4509, Material No. 1.4509 | ThyssenKrupp Nirosta ® 4509, Material No. 1.4509 | one-piece |
| Comparative Example 4 | Titanium, Material No. 3.7024 | Titanium, Material No. 3.7024 | one-piece |

The specimens from Example 1 and the Comparative Examples 2 to 4 were subsequently subjected to a wide variety of tests. In a first series of tests, the specimens were investigated in a temperature change test with regard to their stability, wherein they were subjected to a temperature change from +80° C. to −30° C. In a second series of tests, the connection bridges were bent upward away from the substrate (1) at an angle of 90°, as depicted in FIG. 4. Following that, the specimens were examined with respect to damage to the solder joint and twisting of the connection element. Also, the electrical resistances of the respective connection bridges are compared. These constitute a measure of the conductivity of the connection bridges, which should be as high as possible. Table 3 shows the results of the series of tests for Example 1 as well as the Comparative Examples 2 to 4.

TABLE 3

|  | Temperature Change Test | Reshaping Connection Bridge | Electrical resistance Connection Bridge |
|---|---|---|---|
| Example 1 | No damage | No damage | 1.8 μOhm · cm |
| Comparative Example 2 | Damage from glass spalling | Damage to the solder joint | 1.8 μOhm · cm |
| Comparative Example 3 | No damage | No damage | 60 μOhm · cm |
| Comparative Example 4 | No damage | Damage to the solder joint | 4.7 μOhm · cm |

As can be discerned in Table 3, only in Example 1 and Comparative Example 3, no damage whatsoever occurred to the specimen in the temperature change test as well as at the time of reshaping of the connection bridge. In Comparative Example 2, there was damage to the specimen in temperature change tests. Due to the different coefficients of thermal expansion of the substrate and the connection element, spalling of the glass occurred in the region of the contact surfaces of the connection element. Furthermore, in Comparative Example 2, the solder joint was damaged at the time of reshaping of the connection bridge. Since the connection element in Comparative Example 2 was made of readily reshapable copper, at the time of the bending of the connection bridge, twisting of the bridge-shaped connection element occurred that resulted in this damage. In Comparative Example 4, no damage to the specimen occurred in temperature change tests; however, due to the inadequate rigidity of the connection element, there was damage to the solder joint during the reshaping process. It must also be mentioned that the titanium material used in Comparative Example 4 is expensive and can be soldered only with difficulty. Such damage to the specimen cannot be tolerated in routine production such that only Example 1 and Comparative Example 3 have adequate stability. In Comparative Example 3, the connection element and the connection bridge are made of a poorly conductive steel, as a result of which, in comparison with the Example 1 according to the invention, a significantly greater voltage drop occurs on the connection bridge. This should, however, be kept as low as possible in order to ensure optimal flow of current. Thus, only the solution in Example 1 provides a connection element that has adequate temperature stability and a connection bridge reshapable at will on which only a slight voltage drop occurs. This result was unexpected and surprising for the person skilled in the art.

LIST OF REFERENCE CHARACTERS 1 transparent substrate
2 conductive structure
3 connection element
4 connection bridge
5 leadfree solder material
6 screenprint
7 contact surfaces
7.1 first contact surface
7.2 second contact surface
8 spacers
9 contact bumps
AA' section line
BB' section line

The invention claimed is:
1. A pane with at least one electrical connection element with a connection bridge, comprising at least: a substrate with an electrically conductive structure on at least one subregion of the substrate, at least one electrical connection element on at least one subregion of the electrically conductive structure, a connection bridge on at least one subregion of the connection element, wherein the connection element contains at least 66.5 wt.-% to 89.5 wt.-% iron, 10.5 wt.-% to 20 wt.-% chromium, and one or more selected from the group of carbon, nickel, manganese, molybdenum, niobium, and titanium, and a leadfree solder material, which connects the electrical connection element to the electrically conductive structure in at least one subregion, wherein the difference between the coefficients of thermal expansion of the substrate and the connection element is less than 5×10−6/° C., wherein the connection bridge is implemented as a solid and contains copper, and wherein the material compositions of the connection element and the connection bridge are different.

2. The pane according to claim 1, wherein the connection element contains at least 77 wt.-% to 84 wt.-% iron, and 16 wt.-% to 18.5 wt.-% chromium.

3. A method for producing the pane according to claim 1, comprising:
 electrically conductively affixing a connection bridge on the top of the connection element,
 applying a leadfree solder material on at least one contact surface on the bottom of a connection element,
 arranging the connection element with the leadfree solder material on an electrically conductive structure on a substrate, and
 soldering the connection element to the electrically conductive structure.

4. The method according to claim 3, further comprising subsequently plastically reshaping the connection bridge by one-sided loading on the end of the connection bridge.

5. Use of a pane according to claim 1 as a pane with electrically conductive structures.

6. The pane according to claim 1, wherein the connection bridge contains 58 wt.-% to 99.9 wt.-% copper.

7. The pane according to claim 1, wherein the connection bridge contains 60 wt.-% to 80 wt.-% copper and 20 wt.-% to 40 wt.-% zinc.

8. The pane according to claim 1, wherein an electrical resistance of the connection bridge is between 0.5 μOhm·cm and 20 μOhm·cm.

9. The pane according to claim 1, wherein an electrical resistance of the connection bridge is between 1.0 μOhm·cm and 15 μOhm·cm.

10. The pane according to claim 1, wherein an electrical resistance of the connection bridge is between 1.5 μOhm·cm and 11 μOhm·cm.

11. The pane according to claim 1, wherein the connection element contains at least one of: titanium, iron, nickel, cobalt, molybdenum, copper, zinc, tin, manganese, niobium, chromium, and alloys thereof.

12. The pane according to claim 1, wherein the connection element contains iron alloys.

13. The pane according to claim 1, wherein the connection bridge contains at least one of: titanium, iron, nickel, cobalt, molybdenum, zinc, tin, manganese, niobium, silicon, chromium, and alloys thereof.

14. The pane according to claim 1, wherein the electrically conductive structure contains silver and has a layer thickness of 5 μm to 40 μm.

15. The pane according to claim 1, wherein the electrically conductive structure contains silver particles and glass frits.

16. The pane according to claim 1, wherein the substrate contains glass.

17. The pane according to claim 1, wherein the substrate contains at least one of: flat glass, float glass, quartz glass, borosilicate glass, and soda lime glass.

18. The pane according to claim 1, wherein the leadfree solder material contains at least one of: tin, bismuth, indium, zinc, copper, silver, and alloys thereof.

19. The pane according to claim 1, wherein the leadfree solder material contains 35 wt.-% to 69 wt.-% bismuth, 30 wt.-% to 50 wt.-% tin and 1 wt.-% to 10 wt.-% silver.

\* \* \* \* \*